United States Patent [19]
Sakai et al.

[11] Patent Number: 5,395,226
[45] Date of Patent: Mar. 7, 1995

[54] MOLDING MACHINE AND METHOD

[75] Inventors: Kunito Sakai; Kazuharu Oshio; Hirozoh Kanegae, all of Hyogo, Japan

[73] Assignee: Mitsubishi Denki Kabushiki Kaisha, Tokyo, Japan

[21] Appl. No.: 130,444

[22] Filed: Oct. 1, 1993

[30] Foreign Application Priority Data

Feb. 23, 1993 [JP] Japan .................................. 4-033308

[51] Int. Cl.⁶ ....................... B29C 45/02; B29C 45/14
[52] U.S. Cl. ..................................... 425/116; 249/90; 249/93; 249/95; 264/272.17; 425/117; 425/DIG. 228
[58] Field of Search ...................... 249/91, 93, 95, 135; 425/116, 544, 543, 588, 121, 117, DIG. 228; 264/272.17

[56] References Cited

U.S. PATENT DOCUMENTS

| | | | |
|---|---|---|---|
| 4,470,786 | 9/1984 | Sano et al. | 425/116 |
| 4,952,135 | 8/1990 | Douglas | 425/543 |
| 4,954,307 | 9/1990 | Yokoyama | 425/116 |
| 5,118,271 | 6/1992 | Baird | 425/116 |
| 5,151,276 | 9/1992 | Sato et al. | 264/272.17 |
| 5,336,272 | 8/1994 | Tsutsumi et al. | 264/272.17 |

FOREIGN PATENT DOCUMENTS 1-316237 12/1989 Japan .
2-160518 6/1990 Japan .

*Primary Examiner*—Khanh Nguyen
*Attorney, Agent, or Firm*—Burns, Doane, Swecker & Mathis

[57] ABSTRACT

A molding machine includes a mold composed of lower and upper mold sections. A recess is defined in the lower mold section to receive a lead frame or other objects. The lead frame is sandwiched between the upper and lower mold sections. A mold cavity is defined in the lower mold section below the recess so as to receive a thermosetting resin or encapsulant. A gasket groove is defined adjacent to the mold cavity to receive a gasket. The gasket is subject to plastic deformation upon application of force. An oil chamber is communicated with the gasket groove and contains hydraulic oil. The hydraulic oil is pressurized to urge the gasket against the lead frame. As a result, the gasket is so deformed as to closely contact the surface of the lead frame and seal the mold cavity. The hydraulic oil is preferably mixed with thermoplastic resin in powder form.

6 Claims, 4 Drawing Sheets

MOLDING MACHINE AND METHOD

BACKGROUND OF THE INVENTION

1. Field of the Invention

The present invention relates to a molding machine and method for shaping a plastic or metal substance without producing undesirable burrs.

2. Description of the Related Art

Japanese laid-open patent publication No. 160518/90 discloses a molding machine for encapsulating a circuit or other electronic parts in resin (see FIG. 4). A lead frame is sandwiched between upper and lower molds. The lower mold has a cavity to receive an encapsulating material such as epoxy resin under pressure. A groove is defined around and spaced from the cavity to form a partition therebetween. A resilient gasket made of silicon rubber is fitted in the groove and projects slightly upwardly from the upper surface of the lower mold. When the upper and lower molds are clamped together, the gasket is elastically deformed to closely contact with the lead frame. However, the encapsulating resin still tends to leak between the lower surface of the lead frame and the partition, thereby producing undesirable burrs in the lead frame and the partition. This is due to the fact that the lead frame is placed in metal-to-metal contact with the end surface of the partition and a clearance of the order of a few microns remains between the lead frame and the partition. The resulting burrs in the partition not only physically damage tile gasket, but also cause the molten resin to leak from the mold cavity to thereby chemically damage the gasket. This results in a decrease in the service life of the gasket. Another problem with the resilient gasket is that it can not be so deformed as to closely contact with electronic parts which have irregular surfaces or complicated shapes.

SUMMARY OF THE INVENTION

It is an object of the present invention to provide a molding machine and method which can shape a plastic or metal substance without producing undesirable burrs. According to one aspect of the invention, there is provided a molding machine which comprises a mold composed of first and second mold sections, at least one of the first and second mold sections including a recess adapted to receive an object, the first and second mold sections cooperating to sandwich the object therebetween, a mold cavity adapted to receive a molding material, the mold cavity being open to the object, a gasket groove defined adjacent to the mold cavity, a gasket received in the gasket groove, an oil chamber communicated with the gasket groove and containing a hydraulic oil, and means for pressurizing the hydraulic oil so as to urge the gasket against the object. When the gasket is urged or pressed against the object, it is so deformed as to closely contact the surface of the object regardless of any surface irregularity. The gasket is preferably made of gold or some other malleable metal.

A thermoplastic resin such as polyethylene in powder form is preferably added to the hydraulic oil to seal a clearance between the gasket and gasket groove and thus, prevent the hydraulic oil from flowing into the mold cavity through such a clearance.

According to another aspect of the invention, there is provided a method of forming a molding material integrally with an object, the method comprising the steps of placing a gasket in a mold composed of first and second mold sections, sandwiching the object between the first mold section and the second mold section, pressing the gasket against the object to cause plastic deformation of the gasket, introducing a molding material into a mold cavity, the mold cavity being defined adjacent to the gasket and being open to the object, and curing the molding material.

These and other objects, features and advantages of the invention will become apparent from the following description when taken in conjunction with the accompanying drawings.

DESCRIPTION OF THE PREFERRED EMBODIMENTS

Figure 1:
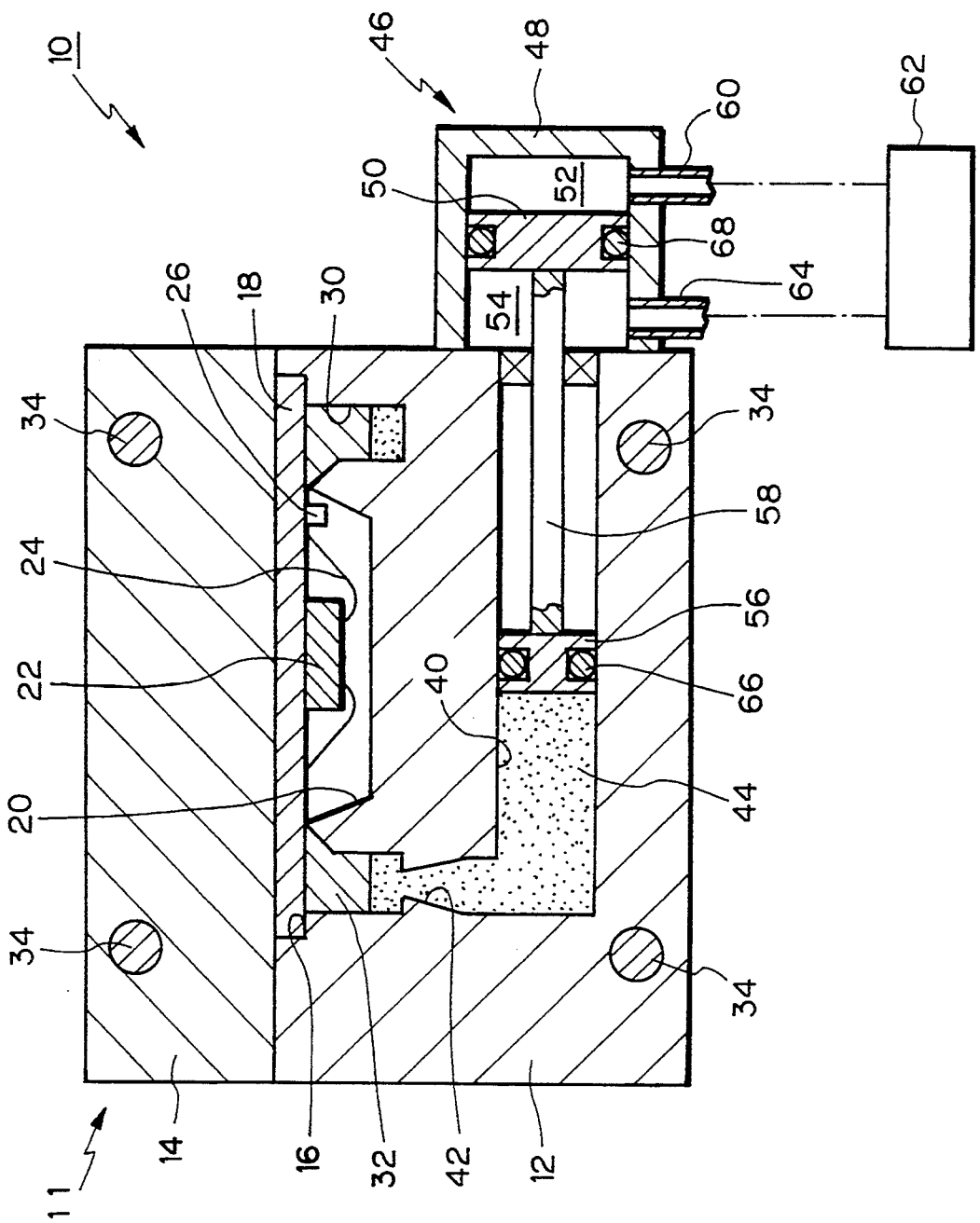
FIG. 1 is a side elevation, in section, of a transfer molding machine according to a first embodiment of the present invention.

Referring to FIG. 1, there is shown a transfer molding machine constructed according to a first embodiment of the present invention and designed to encapsulate electronic parts in resin. Specifically, a molding machine 10 includes a mold 11 made of a lower mold section 12 and an upper mold section 14. The lower mold section 12 has a recess 16 to receive a lead frame 18. The lead frame 18 is in the form of a plate and made of copper, tin, aluminum, kovar, an alloy of iron and nikel, or other materials. The lead frame 18 and the lower mold section 12 cooperate to define a mold cavity 20 below the recess 16. A plurality of semiconductor chips 22 are fixedly mounted on one side of the lead frame 18 and include electrodes (not shown) electrically connected to the lead frame by means of bonding wires 24. The lead frame 18 is sandwiched between the lower mold section 12 and the upper mold section 14 such that the semiconductor chips 22 and their related parts are located within the mold cavity 20. A gate 26 is open to the mold cavity 20 to introduce into the mold cavity 20 a molten thermosetting resin or encapsulant. A gasket groove 30 surrounds the mold cavity 20 and is substantially rectangular as viewed in plan. A gasket 32 is fitted in the gasket groove 30 with its bottom spaced from the bottom of the gasket groove 30. The gasket 32 is made of metal which can be readily deformed by the application of a slight external force. Such metal includes lead, solder, gold, silver, aluminum, copper, tin or other malleable metal. Their alloys may also be employed for this purpose. One side of the gasket groove 30 is inclined toward the mold cavity 20 at an angle of about 45 degrees and terminates at the outer peripheral edge of the mold cavity 20. A plurality of heaters 34 are mounted within the lower mold section 12 and the upper mold section 14 so as to hold a molten resin in the mold cavity 20 at an elevated temperature for a specific time, for example, 90 seconds.

An oil chamber 40 is formed horizontally in the lower mold section 12 and communicated with the gasket groove 30 via a vertical port 42. A hydraulic oil 44 such as silicon oil or mineral oil is filled in the port 42 and part of the oil chamber 40 to urge the gasket 32 against the lead frame 18. The hydraulic oil is preferably mixed with a suitable thermoplastic resin in powder form. The thermoplastic resin preferably includes one or more macromolecular materials such as polyethylene, or polyimide or other engineering plastic which can be melted at an elevated temperature. In order to pressurize the hydraulic oil, an air cylinder 46 is assembled to the lower mold section 12. The air cylinder 46 generally comprises a cylindrical housing 48 secured to one side of the lower mold section 12, a large piston 50 reciprocably received in the cylindrical housing 48 and adapted to divide the interior of the housing 48 into two air chambers 52 and 54, a small piston 56 reciprocably received in the oil chamber 40 and connected to the large piston 50 by a piston rod 58. An air supply pipe 60 is connected to the housing 48 to supply air under pressure from a source 62 of air under pressure to the air chamber 52. Similarly, an air supply pipe 64 is connected to the housing 48 to supply air under pressure from the air source 62 to the air chamber 54. In the illustrated embodiment, the small piston 56 has a diameter of 14 mm, and the large piston 50 has a diameter of 100 mm. If air under a pressure of 5 kg/cm² is supplied to the air chamber 52, the hydraulic oil urges the gasket 32 against the lead frame 18 under a pressure of about 250 kg/cm². An O-ring 66 is fitted around the small piston 56 to seal the hydraulic oil in the oil chamber 40. Similarly, an O-ring 68 is fitted around the large piston 50 to seal the air chambers 52 and 54. It is to be understood that a hydraulic cylinder may alternatively be used to perform the same function as the air cylinder.

Reference will now be made to a method of encapsulating the lead frame according to the present invention.

The closed mold 11 is first placed in a suitable clamp. The heaters 34 are activated to heat the lower mold section 12 and the upper mold section 14 to a temperature of about 180° C. The mold 11 is then opened so that the gasket 32 can be placed in the gasket groove 30. Air under pressure is supplied from the air source 62 to the air chamber 54 through the air supply pipe 64 so as to move the large piston 50 and the small piston 56 backwards or to the right in FIG. 1. This brings about an increase in the volume of the oil chamber 40 in which the hydraulic oil is filled. As a result, the pressure in the oil chamber 40 is decreased to pull the gasket 32 toward the bottom of the gasket groove 30. The lead frame 18 is then, placed in the recess 16 of the lower mold section 12 with the chips 22 and their related parts located within the mold cavity 20. The lower mold section 12 and the upper mold section 14 are pressed against each other by the clamp. At this time, there remains clearance of the order of few microns between the lead frame 18 and the lower and upper mold sections 12, 14 due to their manufacturing tolerances. To this end, air under pressure is fed from the air source 62 to the air chamber 52 through the air supply pipe 60 so as to move the large piston 50 and thus, the small piston 56 forwards or to the left in FIG. 1. As a result, the hydraulic oil is compressed to urge the gasket 32 against the lead frame 18. In the illustrated embodiment, a pressure of 5 kg/cm² is applied to the large piston 50. Since the area of the large piston 50 is about 50 times greater than that of the small piston 56, the small piston 56 is urged under a pressure of 250 kg/cm². When the gasket 20 is pressed, it is subject to plastic deformation and is brought into close contact with the lower surface of the lead frame 18.

Next, a molten thermosetting resin or encapsulant is forced through the gate 26 into the mold cavity 20 under a pressure of about 100 kg/cm². At this time, the gasket 30 is urged against the lead frame 18 under a pressure of about 250 kg/cm² and is so deformed as to closely contact with the lower surface of the lead frame 18 and to prevent leakage of the molten resin from the mold cavity 20. No burrs will result. The molten resin is then cured by the application of heat and pressure. This completes encapsulation of the chips 22 and their related parts. Air under pressure is thereafter fed to the air chamber 54 to move the large piston 50 and the small piston 56 to the right in FIG. 1. This brings about an increase in the volume of the oil chamber 40. As the internal pressure of the oil chamber 40 is thereby reduced, the gasket 32 in no longer urged against the lead frame 18. Finally, the mold 11 is opened to allow removal of the lead frame with the chips and their related parts encapsulated in resin.

Under microscopic inspection, any lead frame will be seen to have regular surface or flaws. Accordingly to the present invention, the gasket 32 is made of a material which is subject to plastic deformation, rather than elastic deformation, upon application of pressure and can be so deformed as to closely contact the surface of a lead frame regardless of any irregularity.

If a pressure of about 250 kg/cm² is exerted on the small piston 56, the hydraulic oil could flow through a clearance between the gasket 32 and the gasket groove 30 and into the mold cavity 20. This deteriorates the quality of a final product. To prevent this, a highly viscous fluid could be used, but it is difficult to fill the gasket groove 30 with such a highly viscous fluid. According to the invention, a thermoplastic resin such as polyethylene in powder form is added to the hydraulic oil, for example, by about 30 weight percent. The diameter of polyethylene powder is in the range of about 5 to 10 microns and is larger than the clearance between the gasket 32 and the gasket groove 30. When the hydraulic oil is compressed, the polyethylene in powder form can not enter the clearance and consequently, accumulates around the lower edge of the gasket 32. When the mold 11 is heated to over 100° C., the polyethylene powder is melted. As this occurs, its viscosity becomes extremely high. The molten polyethylene then flows into the clearance between the gasket and the gasket groove to prevent the hydraulic oil from flowing into the clearance and thus, the mold cavity 20.

Figure 2:
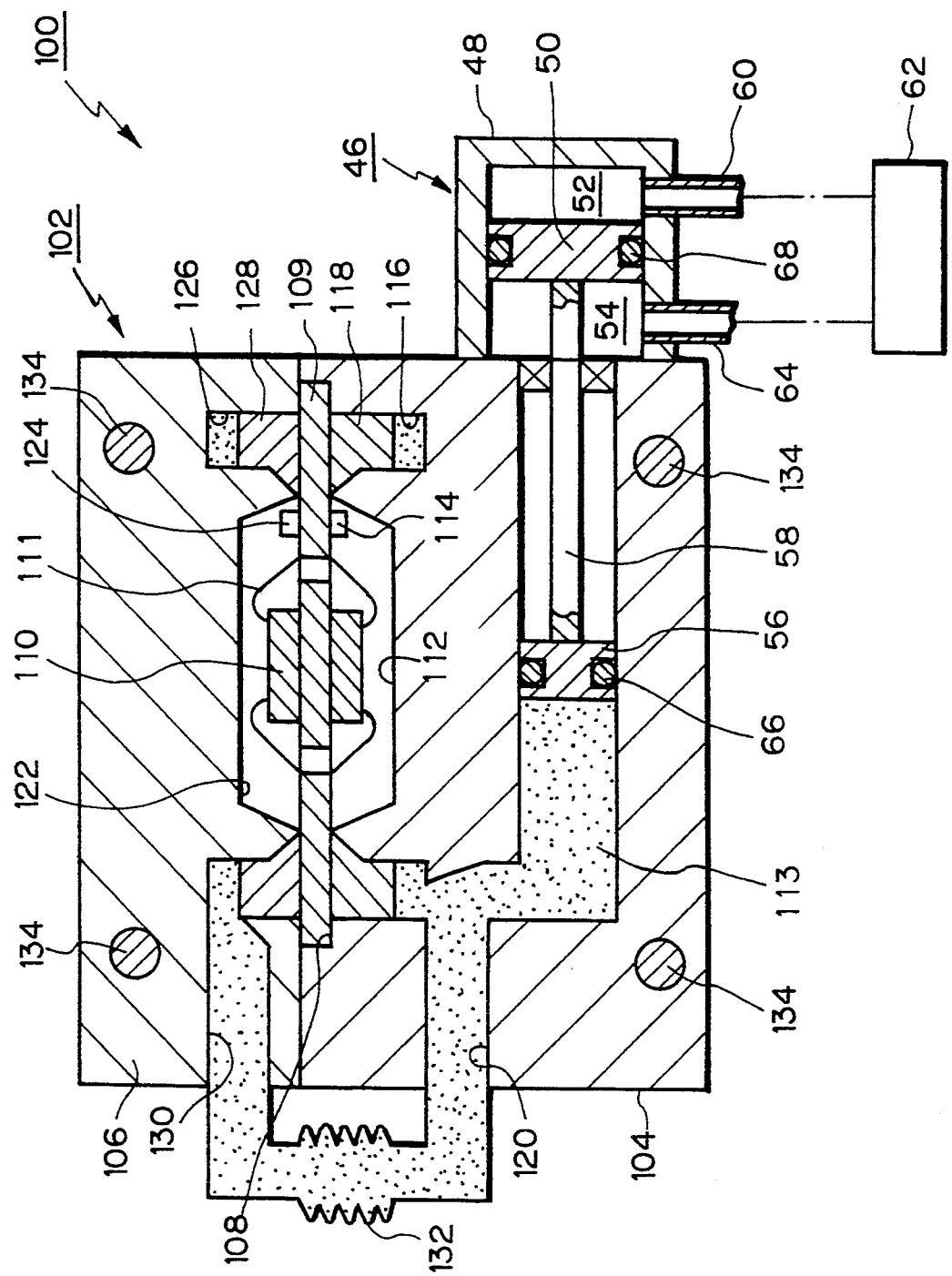
FIG. 2 is a side elevation, in section, of a transfer molding machine according to a second embodiment of the present invention.

FIG. 2 shows a transfer molding machine constructed according to a second embodiment of the present invention and designed to encapsulate semiconductor chips and their related parts fixedly mounted on both sides of a lead frame.

Referring specifically to FIG. 2, a transfer molding machine is generally designated by reference numeral 100 and includes a mold 102 composed of a lower mold section 104 and an upper mold section 106. In the illustrated embodiment, the lower mold section 104 has a recess 108 to receive a lead frame 109. The lead frame 109 has a thickness of about 0.25 mm. A plurality of semiconductor chips 110 are fixedly mounted on both sides of the lead frame 109 and include electrodes (not shown) electrically connected to the lead frame 109 by means of bonding wires 111. A mold cavity 112 is defined below the recess 108 to receive an encapsulant or thermosetting resin through a gate 114. A gasket groove 116 surrounds the mold cavity 112 and adapted to receive a gasket 118 made of gold. One side of the gasket groove 116 is inclined toward the mold cavity 112 at an angle of about 45 degrees and terminates at the outer peripheral edge of the mold cavity 112. An oil chamber 120 is defined horizontally in the lower mold section 104 and communicated with the gasket groove 116.

Similarly, the upper mold section 106 has a mold cavity 122 to also receive the encapsulant through a gate 124. A gasket groove 126 surrounds the mold cavity 122 and adapted to receive a gasket 128 made of gold. An oil chamber 130 is defined horizontally in the upper mold section 106 and communicated with the gasket groove 126. A bellows 132 provides a communication between the oil chamber 120 in the lower mold section 104 and the oil chamber 130 in the upper mold section 106. A plurality of heaters 134 are mounted within the lower mold section 104 and the upper mold section 106.

A hydraulic oil 113 such as silicon oil is filled in the oil chambers 120 and 130. To pressurize the hydraulic oil to urge the gaskets 118 and 128 against the lead frame 109, the mold is provided with an air cylinder. The air cylinder is identical in structure and operation to that shown in FIG. 1 and will not be described herein. Like reference numerals in FIG. 2 designate like elements shown in FIG. 1.

In operation, the closed mold 102 is first placed in a suitable clamp (not shown). The heaters 134 are activated to heat the lower mold section 104 and the upper mold section 106 to a temperature of about 180° C. The mold 102 is then opened so that the gaskets 118 and 128 can be placed in the gasket grooves 116 and 126, respectively. Air under pressure is supplied from the air source 62 to the air chamber 54 through the air supply pipe 64 so as to move the large piston 50 and the small piston 56 backwards or to the right in FIG. 2. This brings about an increase in the volume of the oil chambers 120 and 130. As a result, the pressure in the oil chambers is decreased to pull the gaskets 118 and 128 toward the bottoms of the gasket grooves 116 and 126, respectively. The lead frame 109 is then placed in the recess 108 of the lower mold section 104 with the semiconductor chips 110 and their related parts located within the respective mold cavities 112 and 122. The lower mold section 104 and the upper mold section 106 are pressed against each other by the clamp. Air under pressure is then fed from the air source 62 to the air chamber 52 through the air supply pipe 60 so as to move the large piston 50 and the small piston 56 forwards or to the left in FIG. 1. As a result, the hydraulic oil is compressed to urge the gaskets 118 and 128 against the lead frame 18. In the illustrated embodiment, a pressure of 5 kg/cm$^2$ is applied to the large piston 50 to urge the small piston 56 under a pressure of 250 kg/cm$^2$. The gaskets 118 and 128 are subject to plastic deformation by the application of this pressure and is brought into close contact with the lower and upper surfaces of the lead frame 109, respectively.

Next, a molten thermosetting resin or encapsulant is forced through the gates 114 and 124 into the respective mold cavities 112 and 122 under a pressure of about 100 kg/cm$^2$. At this time, the gaskets 118 and 128 are urged against the lead frame 109 under a pressure of about 250 kg/cm$^2$ and are so deformed as to closely contact the lower and upper surfaces of the lead frame 109 to seal the mold cavities and thus, prevent leakage of the molten thermosetting resin from the cavities. The molten resin is then cured by the application of heat and pressure. This completes encapsulation of the chips 22 and their related parts. Air under pressure is thereafter fed to the air chamber 54 to move the large piston 50 and the small piston 56 to the right in FIG. 2. This brings about an increase in the volume of the oil chambers 120 and 130. As the internal pressure of the oil chambers is thereby reduced, the gaskets 118 and 128 are no longer pressed against the lead frame 109. Finally, the mold 102 is opened to allow removal of the lead frame 109 with the semiconductor chips 110 and their related parts encapsulated in resin.

Figure 3:
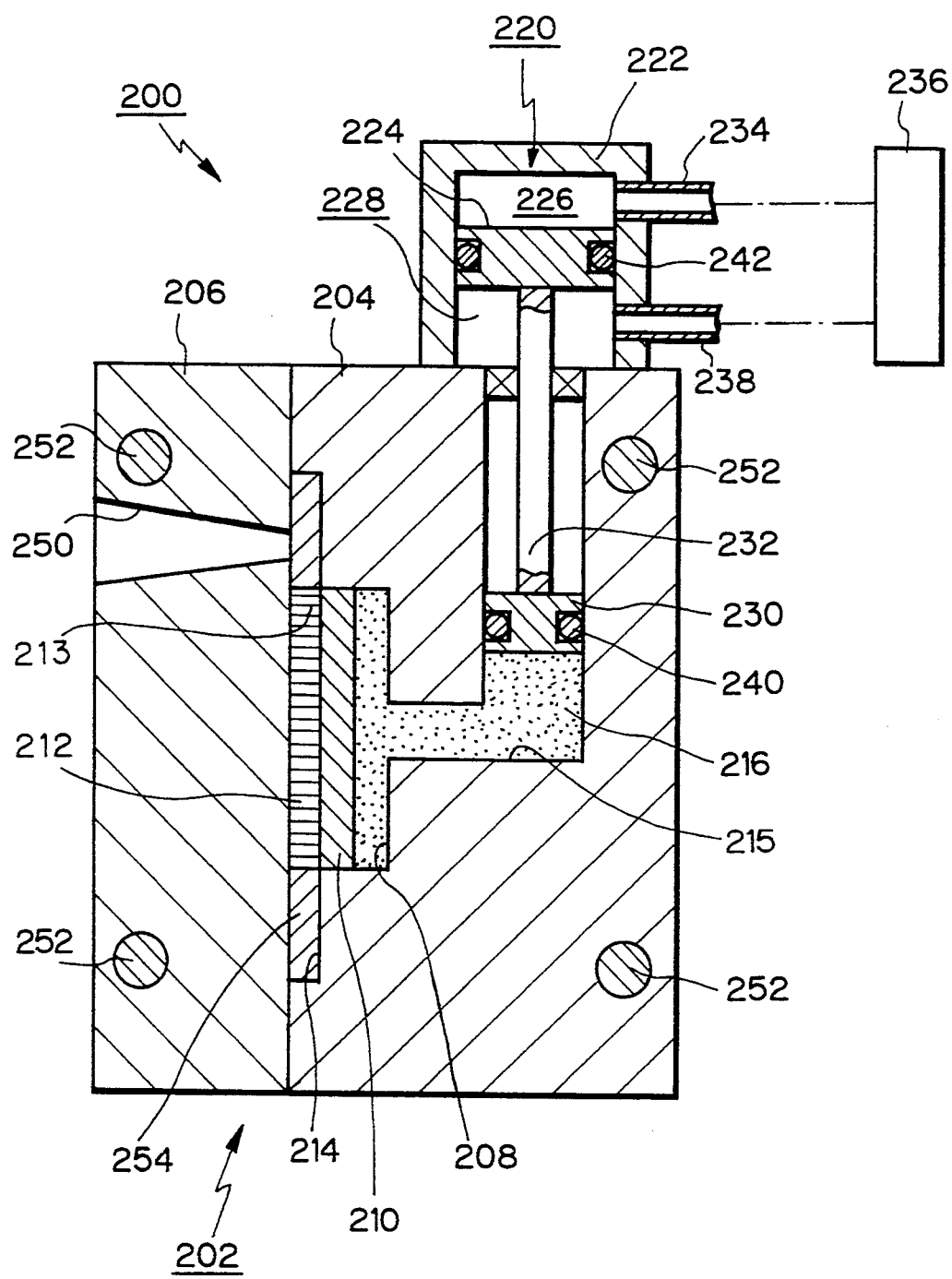
FIG. 3 is a side elevation, in section, of an injection molding machine according to a third embodiment of the present invention.
Figure 4:
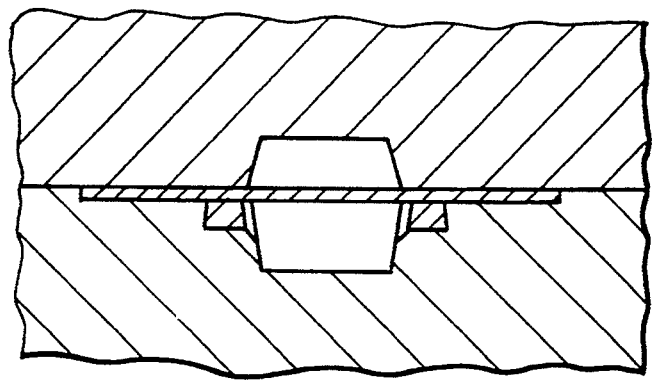
FIG. 4 is a sectional view, in part, of a conventional mold.

Referring to FIG. 3, there is illustrated an injection molding machine made according to a third embodiment of the present invention and designed to integrally form a molded flange around a filter element. Specifically, an injection molding machine 200 includes a mold 202 composed of a right mold section 204 and a left mold section 206. The right mold section 204 has a substantially cylindrical recess 208 to receive a substantially circular gasket 210. The gasket 210 is made of solder or other materials which can easily be deformed by the application of force or pressure. A filter element 212 is received in the cylindrical recess 208 and sandwiched between the gasket 210 and one side of the left mold section 206. The filter element 212 is in the form of a circular disk and has a thickness of 2 mm. A multiplicity of holes 213 are formed in the filter element 212 and have a diameter of 0.1 to 1.0 mm. The gasket 210 has substantially the same diameter as the filter element. A mold cavity 214 is defined in the right mold section 204 and surrounds the cylindrical recess 208. The cylindrical recess 208 is communicated with an oil chamber 215 to receive a hydraulic oil 216 such as silicon oil. In order to pressurize the hydraulic oil to urge the gasket 210 against the filter element 212, an air cylinder 220 is attached to the right mold section 204. As in the previous embodiments, the air cylinder 220 comprises a cylindrical housing 222 secured to the upper surface of the right mold section 204, a large piston 224 reciprocably received in the cylindrical housing 222 and adapted to divide the interior of the housing 222 into two air chambers 226 and 228, a small piston 230 reciprocably received in the oil chamber 215 and connected to the large piston 224 by a piston rod 232. An air supply pipe 234 is connected to the housing 222 to supply air under pressure from a source 236 of air under pressure to the air chamber 226. Similarly, an air supply pipe 238 is connected to the housing 222 to supply air under pressure from the air source 236 to the air chamber 228. The small piston 230 has a diameter of 14 mm, and the large piston 224 has a diameter of 100 mm. If air under a pressure of 5 kg/cm$^2$ is supplied to the air chamber 226, the hydraulic oil urges the gasket 210 against the filter element 212 under a pressure of about 250 kg/cm$^2$. An O-ring 240 is fitted around the small piston 230 to seal the hydraulic oil in the oil chamber 215. Similarly, an O-ring 242 is fitted around the large piston 224 to seal the air chamber 226 and the air chamber 228. It is to be understood that a hydraulic cylinder or a combination of an electric motor and a feed screw may alternatively be employed to urged the gasket against the filter element under a constant pressure.

A sprue 250 is defined in the left mold section 206 to introduce into the mold cavity 214 a thermoplastic resin such as polybutylene terephthalate. A plurality of heaters 252 are mounted within the right mold section 204 and the left mold section 206.

In operation, the gasket 210 is fitted in the recess 208. The right mold section 204 and the left mold section 206 are mounted in a suitable clamp (not shown) with the right and left mold sections closed. The mold 202 is then heated to a temperature of about 100° C. by the heaters 252. The left mold section 206 is moved away from the right mold section 204 to allow insertion of the filter element 212 in the recess 208 adjacent to the gasket 210. At this time, air under pressure is supplied to the air chamber 228 so as not to urge the gasket 210 against the filter element 212. After the filter element 212 has been inserted, the left mold section 206 is moved toward the right mold section 204 to sandwich the filter element 212 between the right mold section 204 and the lower mold section 206. Air under pressure is then supplied to the air chamber 226 to move the large piston 226 and thus, the small piston 230 downwards so as to press the gasket 210 against the filter element 212. As a result, the gasket 210 is so deformed as to fill all the holes 213 of the filter element 212. The thermoplastic resin is supplied through the sprue 250 to the mold cavity 214 under a pressure of about 1000 kg/cm$^2$. This pressure will be reduced to about 200 kg/cm$^2$ when the mold cavity 214 has been completely filled. Since the gasket 210 is deformed not only to closely contact the inner surface of the filter element 21, but also to fill the holes 213 and closely contact one side of the left mold section 206 adjacent to the filter element 212, no resin can enter between the filter element 212 and the gasket 210 and between the filter element 212 and the inner side of the left mold section 206.

After the thermoplastic resin in the mold cavity 214 has been cured, air under pressure is supplied to the air chamber 228 to move the large piston 224 and the small piston 230 upwards to reduce the pressure in the oil chamber 215. The left mold section 206 is then moved away from the right mold section 204 to allow removal of the filter element with the molded flange 254. As the gasket 212 is subject to plastic deformation by the application of force, it can closely be fitted into holes of different size in another filter element.

It will be apparent to those skill in the art that the present invention is also applicable to a die casting or low wax process.

Although several embodiments of the invention have been described in detail, it is to be understood that many modifications and changes may be made without departing from the spirit of the invention and the scope of the appended claims.

What is claimed is:

1. A molding machine comprising a mold including first and second mold sections, at least one of said first and second mold sections including a recess adapted to receive an object, said first and second mold sections cooperating to sandwich the object therebetween, a mold cavity adapted to receive a molding material, said mold cavity being open to the object, a gasket groove defined adjacent to said mold cavity, a gasket received in said gasket groove, an oil chamber communicated with said gasket groove and containing a hydraulic oil, and means for pressurizing the hydraulic oil so as to urge said gasket against the object, said gasket being subject to plastic deformation when said gasket is pressed against the object.

2. A molding machine according to claim 1, wherein said gasket is made of a malleable material.

3. A molding machine according to claim 2, wherein said gasket is made of gold.

4. A molding machine according to claim 1, wherein said hydraulic oil includes a thermoplastic resin in powder form.

5. A molding machine according to claim 4, wherein said thermoplastic resin includes polyethylene.

6. A molding machine according to claim 4, wherein said thermoplastic resin includes polyimide.

* * * * *